(12) United States Patent
Krupenkin et al.

(10) Patent No.: US 7,695,550 B2
(45) Date of Patent: Apr. 13, 2010

(54) STRUCTURED MEMBRANE WITH CONTROLLABLE PERMEABILITY

(75) Inventors: Thomas Nikita Krupenkin, Warren, NJ (US); Victor Alexander Lifton, Bridgewater, NJ (US); Joseph Ashley Taylor, Springfield, NJ (US); Brijesh Vyas, Warren, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 837 days.

(21) Appl. No.: 11/460,901

(22) Filed: Jul. 28, 2006

(65) Prior Publication Data

US 2006/0255171 A1    Nov. 16, 2006

Related U.S. Application Data

(63) Continuation-in-part of application No. 10/835,639, filed on Apr. 30, 2004, now Pat. No. 7,323,033.

(51) Int. Cl.
*B01D 53/22* (2006.01)

(52) U.S. Cl. .................. 96/4; 96/6; 96/11; 96/12; 95/45; 95/46; 95/52; 210/640; 210/650; 210/490; 210/500.21; 210/500.22; 429/41; 429/44; 429/110; 429/112; 429/122; 427/250

(58) Field of Classification Search .............. 96/4, 96/6, 7, 8, 10, 11, 12, 14; 95/45, 52, 46; 210/640, 644, 650, 488, 490, 500.21, 500.22; 429/41, 44, 110, 112, 122; 427/250
See application file for complete search history.

(56) References Cited

U.S. PATENT DOCUMENTS

| 6,185,961 | B1 | 2/2001 | Tonucci et al. | |
|---|---|---|---|---|
| 6,602,932 | B2 | 8/2003 | Feldheim et al. | |
| 6,685,810 | B2* | 2/2004 | Noca et al. | 210/500.22 |
| 6,793,821 | B2 | 9/2004 | Lee et al. | |
| 6,893,562 | B2* | 5/2005 | Busnach et al. | 210/248 |
| 6,913,697 | B2* | 7/2005 | Lopez et al. | 210/650 |
| 7,005,593 | B2 | 2/2006 | Gasparyan et al. | |
| 7,048,889 | B2 | 5/2006 | Arney et al. | |

(Continued)

FOREIGN PATENT DOCUMENTS

WO    WO03016040    2/2003

OTHER PUBLICATIONS

Washizu, "Electrostatic Actuation of Liquid Droplets for Microreactor Applicaitons", IEEE Transactions on Industry Applicaitons, IEEE Inc., NY, vol. 34, No. 4, Jul. 1998, pp. 732-737.

(Continued)

*Primary Examiner*—Jason M Greene
(74) *Attorney, Agent, or Firm*—Hitt Gaines, PC

(57) ABSTRACT

An apparatus that comprises a membrane having a plurality of fluid-support-structures and openings located between the fluid-support-structures. The fluid-support-structures have at least one dimension that that is about 1 millimeter or less. The apparatus also comprises a wicking material positioned adjacent to a surface of the membrane. When a fluid locatable on a surface of the fluid-support-structures penetrates the fluid-support-structures, at least a portion of the fluid passes through the openings and into the wicking material.

20 Claims, 9 Drawing Sheets

U.S. PATENT DOCUMENTS

| | | | |
|---|---|---|---|
| 7,140,495 B2 * | 11/2006 | Hester et al. | 210/490 |
| 7,309,385 B2 * | 12/2007 | Hong et al. | 96/11 |
| 7,323,033 B2 * | 1/2008 | Kroupenkine et al. | 95/45 |
| 7,390,760 B1 * | 6/2008 | Chen et al. | 442/341 |
| 2004/0191127 A1 | 9/2004 | Kornblit et al. | |
| 2005/0039661 A1 | 2/2005 | Kornblit et al. | |
| 2005/0069458 A1 | 3/2005 | Hodes et al. | |
| 2005/0106459 A1 | 5/2005 | Kroupenkine et al. | |
| 2005/0203613 A1 | 9/2005 | Arney et al. | |
| 2005/0208370 A1 | 9/2005 | Hodes et al. | |
| 2005/0211505 A1 | 9/2005 | Kroupenkine et al. | |
| 2005/0269743 A1 | 12/2005 | Kroupenkine et al. | |

OTHER PUBLICATIONS

Homma, et al., "Aligned island formation using step-band networks on Si(111)", Journal of Applied Physics, American Institution of Physics, NY, vol. 86, No. 6, Sep. 15, 1999, pp. 3083-3088.

Kim, et al., "Nanostructured Surfaces for Dramatic Reduction of Flow Resistance in Droplet-Based Microfluidics", IEEE, pp. 479-482 (2002).

Cottin-Bizonne, et al., "Low-friction flows of liquid at nanopatterned interfaces", Nature Materials, vol. 2, Sep. 9, 2003, pp. 237-240.

Lau, et al., "Superhydrophobic Carbon Nanotube Forests", Nano Letters, vol. 3, No. 12, Oct. 22, 2003, pp. 1701-1705.

Krupenkin, et al., "From Rolling Ball to Complete Wetting: The Dynamic Tuning of Liquids on Nanostructured Surfaces", American Chemical Society, Jan. 8, 2004, 4 pages.

European Search Report, Appl. No. 05252369.3-2003 PCT, Sep. 29, 2005.

* cited by examiner

STRUCTURED MEMBRANE WITH CONTROLLABLE PERMEABILITY

CROSS-REFERENCE TO RELATED APPLICATION

This application is a continuation-in-part of U.S. patent application Ser. No. 10/835,639, entitled, NANOSTRUCTURED SURFACES HAVING VARIABLE PERMEABILITY, filed on Apr. 30, 2004, by Kroupenkine et al., and now issued U.S Pat. No. 7,323,033, which is assigned to Lucent Technologies, Inc., and incorporated herein by reference herein in its entirety.

TECHNICAL FIELD OF THE INVENTION

The present invention is directed, in general, to nanostructured or microstructured surfaces and more specifically, to nanostructured or microstructured surfaces having controllable permeability.

BACKGROUND OF THE INVENTION

This section introduces aspects that may be helpful to facilitating a better understanding of the invention. Accordingly, the statements of this section are to be read in this light. The statements of this section are not to be understood as admissions about what is in the prior art or what is not in the prior art.

Certain surfaces having a nanostructured or microstructured surface with raised features may provide a superhydrophobic surface. E.g., as discussed in U.S. Patent Applications 2005/0039661 and 2004/0191127, which are incorporated by reference herein in their entirety, a droplet of fluid on a superhydrophobic surface will appear as a suspended drop having a contact angle of at least about 140 degrees. Applying a voltage between the surface and the droplet can cause the surface to become electro-wetted, as indicated by the suspended drop having a contact angle of less than 90 degrees.

In many applications, it is desirable to be able to control the passage of a fluid below the surface and through a substrate supporting the nanostructures or microstructures. For example, as discussed in the 10/835,639 application, electrowetting or changes in ambient pressure can be used to actuate a fluid to penetrate into structured surfaces located on a substrate and through openings in the substrate. In some cases, however, the fluid may go down to the bottom of the structured surfaces, but not pass through the openings.

Embodiments of the invention overcome this deficiency by providing an apparatus that facilitates the passage of fluid through the openings.

SUMMARY OF THE INVENTION

To address one or more of the above-discussed deficiencies, one embodiment is an apparatus. The apparatus comprises a membrane having a plurality of fluid-support-structures and openings located between the fluid-support-structures. The apparatus also comprises a wicking material positioned adjacent to a surface of the membrane. The fluid-support-structures have at least one dimension that that is about 1 millimeter or less. When a fluid locatable on a second surface of the membrane penetrates the fluid-support-structures, at least a portion of the fluid passes through the openings and into the wicking material.

Another embodiment is a method that comprises moving a fluid through the above-described apparatus. Moving the fluid includes placing the fluid on a surface of the membrane of the apparatus. The membrane is actuated to cause the fluid to move through the fluid-support-structures to the openings and drawn into the wicking material of the apparatus, the wicking material being positioned adjacent to a surface of the membrane.

Another embodiment is a method of manufacturing the above-described apparatus. The method comprises forming a membrane including forming the fluid-support-structures on or in a substrate and forming openings in said substrate. The wicking material is positioned adjacent the openings.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

Embodiments of the present invention benefit from the recognition of the presence of forces that impede the passage of a fluid through the openings of a membrane having fluid-support-structures. The impeding forces include the adhesive forces between molecules of the fluid and the walls of the fluid-support-structures, and the cohesive forces of molecular attraction between the molecules of the fluid. It was discovered that these impeding forces can be overcome by positioning a wicking material adjacent to the openings. The fluid is drawn through the openings and into the wicking material, thereby facilitating passage of the fluid through the openings.

The term wicking material as used herein refers to any permeable media that promotes the absorption of the fluid into the permeable media by capillary forces. Each fluid-support-structure can be a nanostructure or microstructure. The term nanostructure as used herein refers to a predefined raised feature on a surface that has at least one dimension that is about 1 micron or less. The term microstructure as used herein refers to a predefined raised feature on a surface that has at least one dimension that is about 1 millimeter or less. The term fluid as used herein refers to any liquid, vapor, gas or mixture thereof (e.g., gas dissolved or suspended in a liquid) that is locatable on the fluid-support-structure and able pass through the openings.

Figure 1:
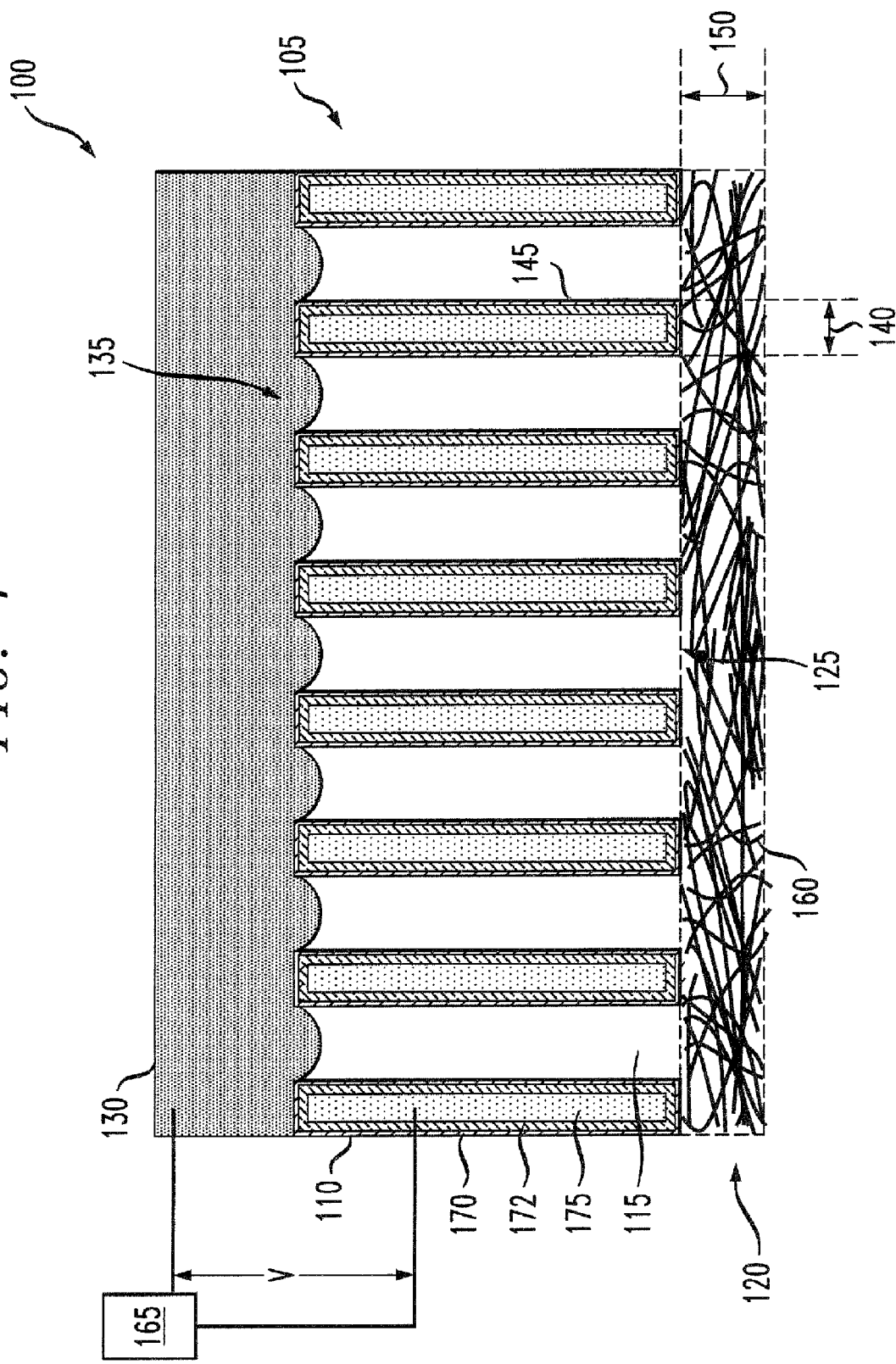
FIG. 1 presents a cross-sectional view of an example apparatus.

One embodiment of the present invention is an apparatus. FIG. 1 presents a cross-sectional view of an example apparatus 100. The apparatus 100 comprises a membrane 105 having a plurality of fluid-support-structures 110 and openings 115 located between the fluid-support-structures 110. The fluid-support-structures 110 have at least one dimension that that is about 1 millimeter or less, that is, they can be nanostructures or microstructures.

The apparatus 100 further includes a wicking material 120 positioned adjacent to a surface 125 of the membrane 105. The wicking material 120 is configured such that when a fluid 130 locatable on a second surface 135 of the membrane 105 penetrates the fluid-support-structures 110, at least a portion of the fluid 130 passes through the openings 115 and into the wicking material 120. E.g., the wicking material 120 is positioned adjacent the surface 125 that the fluid 130 is intended to move towards when the membrane 105 is actuated to allow fluid 130 to penetrate through the second surface 135 of fluid-support-structures 110.

In some embodiments of the apparatus 100, as depicted in FIG. 1, the membrane 105 comprises fluid-support-structures 110 each configured as a cells. In these cases, the at least one dimension that is about 1 millimeter or less is a thickness 140 of a wall 145 of the cell-configured fluid-support-structure 110. The openings 115 are in the enclosures formed by the walls 145 of each cell-configured fluid-support-structure 110.

In other embodiments of the apparatus 100, each fluid-support-structure 110 is configured as a cell. The cells can prescribe a hexagonal shape in the lateral dimensions of the figure, although in other cases the cells prescribe circular, square, octagonal or other geometric shapes. It is not necessary for each of the cell-configured fluid-support-structure 110 to have shapes and dimensions that are identical to each other and to be interconnected, as shown in FIG. 1, although this is sometimes preferred for ease of manufacture and predictability of the fluid's 130 behavior on the surface 135.

Certain cell-shaped fluid-support-structures 110 are preferred because they have a combination of mechanical strength, can be configured to have superhydrophobic and electro-wetting properties, and are simple to manufacture. E.g., fluid-support-structures 110 that prescribe hexagonal shaped cells are preferred because this structure is easier to manufacture than e.g., a circular cell, and because this structure is inherently stable and able to distribute mechanical stresses across the entire structure.

Figure 2:
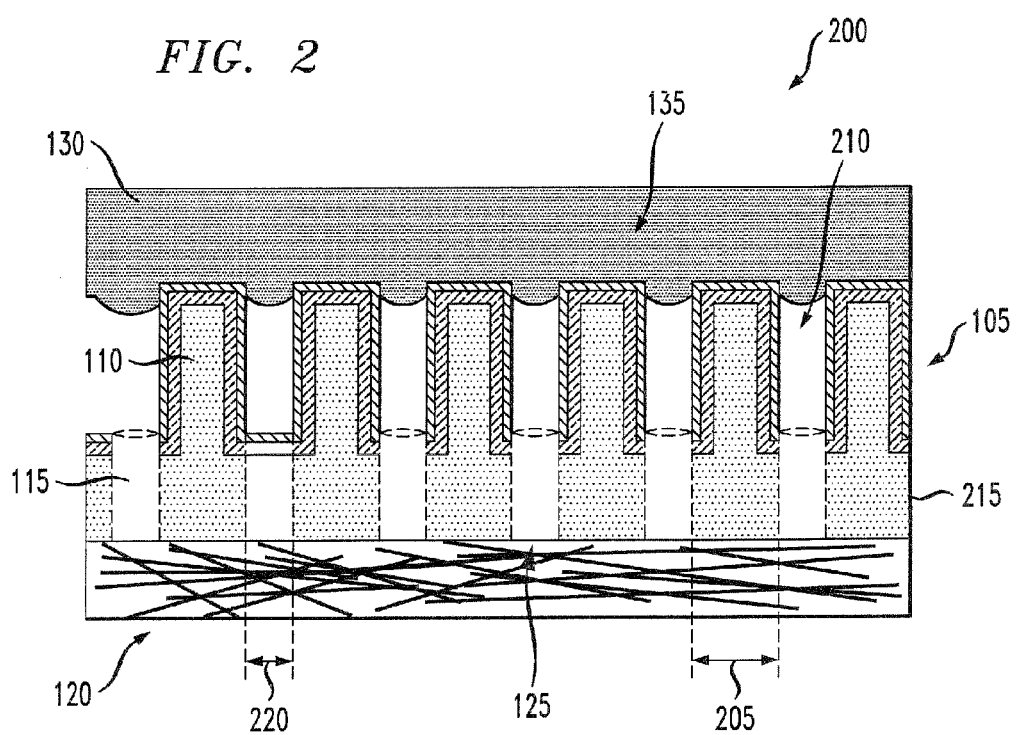
FIG. 2 presents a cross-sectional view of another example apparatus.

However, in other embodiments of the apparatus 200, such as depicted in FIG. 2 (using similar reference numbers for analogous features depicted in FIG. 1), the membrane 105 comprises fluid-support-structures 110 that are each configured as raised structures (e.g., posts). In this case, the one dimension that is about 1 millimeter or less is a lateral thickness 205 of the post-shaped fluid-support-structures 110. The post-shaped fluid-support-structures 110 project from a surface 210 of a base substrate 215. The openings 115 are formed in the base substrate 215 and are disposed between the fluid-support-structures 110.

Returning to FIG. 1, the thickness 150 of the wicking material 120 needs to be sufficient to generate a suitable capillary force to draw the fluid 130 down into it. E.g., in some embodiments, the thickness 150 is at least about 1 micron. The thickness 150 of the wicking material 120 can be increased to absorb increased amounts of fluid 130, if desired. E.g., in some embodiments, the thickness 150 ranges from about 1 micron to 1000 microns.

Preferred embodiments of the wicking material 120 comprise a hydrophilic permeable media. The hydrophilic permeable media can comprise any material that has a high wetability, e.g., a planar surface of the material would support a droplet of fluid thereon such that the droplet has a contact angle of about 90 degrees or less. Some preferred embodiments of the hydrophilic permeable media comprise fibers 160, e.g., non-woven synthetic fibers, such as silica glass fibers or similar inorganic fibers like carbon or ceramic fibers. In other cases, however, the fibers 160 can comprise organic polymers, such as polyester or cellulose. In other still instances, the fibers 160 can be woven.

Figure 3:
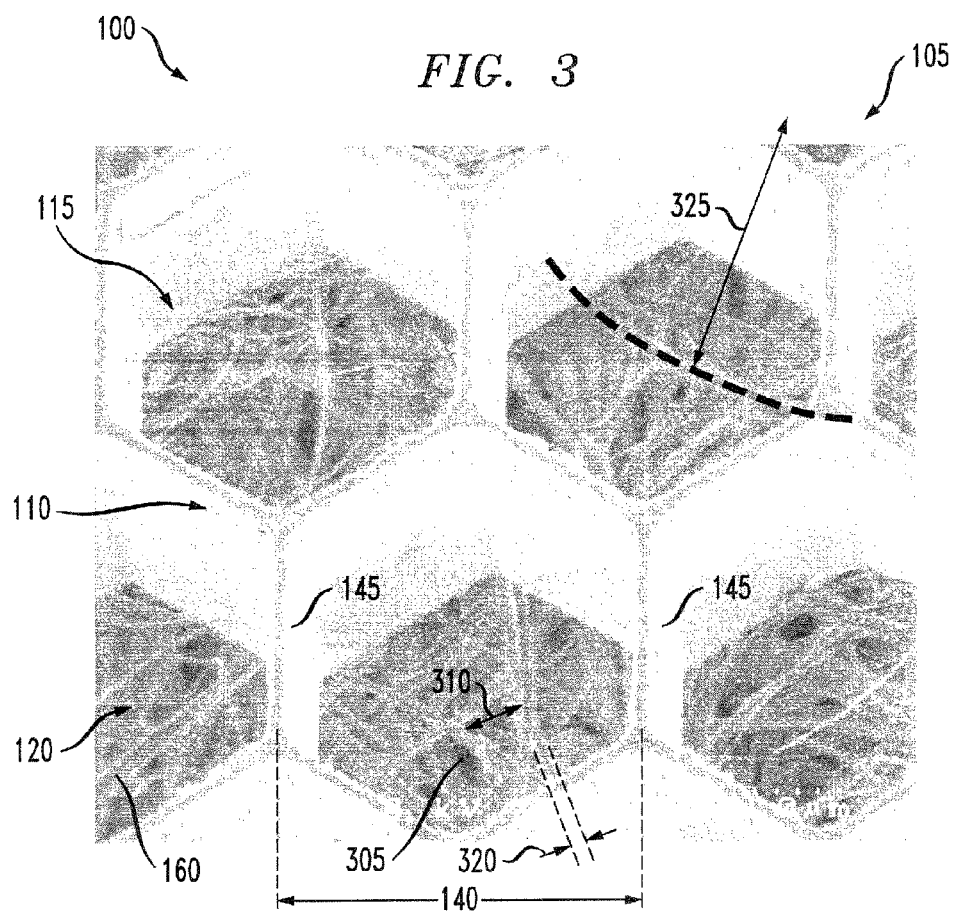
FIG. 3 shows detailed plan view the example apparatus presented in FIG. 1.

FIG. 3 presents a perspective view from an electron scanning microscopic image of the wicking material 120 located in the vicinity of one of the openings 115 of an example apparatus 100 such as described for FIG. 1. FIG. 3 depicts an embodiment of fluid-support-structures 110 that are configured as cells that prescribe a hexagonal shape. As illustrated in FIG. 3, the wicking material 120 has gaps 305 between the fibers 160. The ability of the wicking material 120 to have the desired capillary action on a fluid depends upon several factors: the diameter of the fibers, the size of the gaps between fibers, and the hydrophilic properties of the fibers.

Configuring the size of the gaps 305 relative to the size of the openings 115 is important to achieving the appropriate capillary action, so that the fluid 130 is drawn from between the fluid-support-structures 110 and into the wicking material 120. The size of the gaps 305 can be characterized by a lateral separation 310 between the fibers 160. In some preferred embodiments, an average lateral separation 310 of the gaps 305 is at least about 5 times, and more preferably at least about 10 times, less than a lateral distance 315 of the openings 115 (e.g., the maximum lateral separation between opposing walls 145 of the cell). For instance, in embodiments where the lateral distance 315 is about 1 to 10 microns, then the average separation 310 of the gaps 305 is about 0.2 to 2 microns, respectively, and more preferably about 0.1 to 1 microns, respectively.

One skilled in the art would appreciate how the fiber's diameter 320 can be controlled by e.g., the adjusting the process used to draw inorganic or organic materials (e.g., polymers) into fibers. In some cases, the average lateral separation 310 between fibers 160 is substantially the same as the average diameter 320 of the fibers 160. Therefore in some preferred embodiments, when the average diameter 320 ranges from about 100 to 700 nanometers then the average lateral separation 310 between fibers 160 is also about 100 to 700 nanometers.

In some embodiments, it is desirable for the wicking material 120 to not protrude into the openings 115 because this can interfere with controlling the extent to which the fluid 130 penetrates into the fluid-support-structures 110. In such cases, it is preferable, for the wicking material 120 to comprise fibers 160 having a bend radius 325 that is at least about 5 times, and more preferably, about 10 times, greater than the lateral distance 315 of the openings 115. The term bend radius 325 as used herein refers to the minimum radius that each of the fibers 160 take while being formed in a wicking material without breaking. For the example, where the lateral distance 315 is about 1 to 10 microns, then the bend radius 325 is preferably at least about 5 to 50 microns, respectively, and more preferably about 10 to 100 microns, respectively. In other embodiments, however, portions of the wicking material 120 may protrude into the openings 115.

Figure 4:
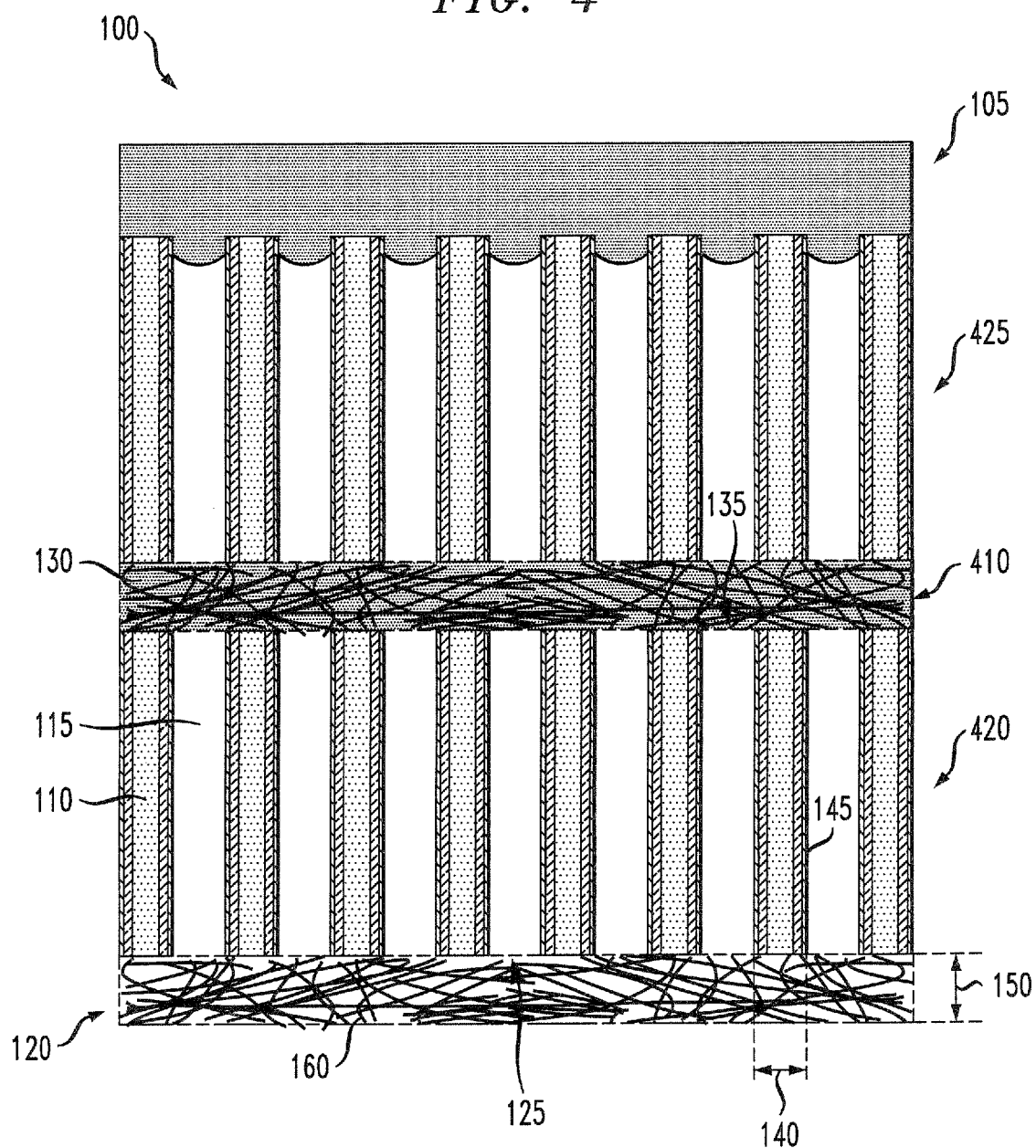
FIG. 4 presents a cross-sectional view of still another example apparatus.

As illustrated in FIG. 4, some embodiments of the apparatus 400 further include a second wicking material 410 positioned adjacent to a second surface 135 of the membrane 105. That is, the second surface 135 is on the opposite side of the membrane's surface 125 that the first wicking material 120 is adjacent to. The second wicking material 410 beneficially promotes the formation of a uniform layer of fluid 130 on the surface 135. For instance, when the fluid-support-structures 110 forms a superhydrophobic surface 135, the fluid 130 can form individual droplets instead of a uniform layer. This, in turn, can make it difficult to pass uniform amounts of fluid 130 through openings 115 located in different areas of the membrane 105. Saturating a layer of the second wicking material 410 with the fluid 130 helps to ensure that the fluid is uniformly distributed over the surface 135.

FIG. 4 further illustrates an embodiment of the apparatus 400, where the membrane 105 is a multilayered membrane. Each of a plurality of membrane layers 420, 425 comprises the fluid-support-structures 110 and openings 115. Each one of the membrane layers 420, 425 is adjacent to at least one of the plurality of layers of wicking material 120, 410.

A multilayered membrane 105 is advantageous because it allows greater control over passing the fluid 130 through the openings 115. E.g., the rate at which the fluid 130 passes through the openings 115 can be controlled by independently actuating the membrane layers 420, 425 to be more or less permeable to the fluid 130. Additionally, the type, size and number of the fluid-support structures 110 and the openings 115 can be different for each membrane layer 420, 425, thereby providing multiple means for controlling the passage of fluid 130.

As discussed in the 10/835,639 application, there are numerous ways of actuating the membrane so that the fluid penetrates the fluid-support-structures. E.g., the membrane 105 can manufactured from a flexible material. The flexible membrane 105 can be configured such that the separation distance 220 (e.g., FIG. 2) between fluid-support-structures 110 increases when a mechanical force is applied to bend or stretch the membrane 105. Increasing the separation distance 220 alters the membrane's surface tension such that the surface 135 no longer supports the fluid 130.

Alternatively the penetration of the fluid can be actuated by applying a voltage between the fluid and the fluid-support-structures. For instance, as illustrated in the embodiment shown in FIG. 1, the fluid-support-structures 110 can be electrically connected, and the apparatus 100 further includes an electrical source 165 that is electrically coupled to the fluid-support-structures 110. The electrical source 165 is configured to apply a voltage (V) between the electrically connected fluid-support-structures 110 and the fluid 130, to thereby cause the fluid 130 to have a contact angle of less than 90 degrees and thereby penetrate the fluid-support-structures 110.

In some preferred embodiments of the apparatus 100, the fluid-support-structures 110 provide a superhydrophobic surface 135. In the absence of an applied voltage (V) as a surface 135 is substantially impermeable to the fluid 130. To facilitate providing the superhydrophobic surface 135, the fluid-support-structures 110 preferably comprise a conductive core 170 (e.g., a metal such as tantalum) surrounded by a dielectric layer 172 (e.g., tanalum oxide) and a coating of low surface energy material 175. E.g., the coating of low surface energy material 175 can be a fluorinated polymer like polytetrafluoroethylene, or an alkylsilane like polydimethylsilane. The term low surface energy material, as used herein, refers to a material having a surface energy of about 22 dyne/cm (about $22 \times 10^{-5}$ N/cm) or less. Those of ordinary skill in the art would be familiar with the methods to measure the surface energy of materials. In some instances, the dielectric layer 172 and low surface energy coating 175 can comprise a single material, such as Cytop® (Asahi Glass Company, Limited Corp. Tokyo, Japan), a fluoropolymer that is both an electrical insulator and low surface energy material.

Figure 5:
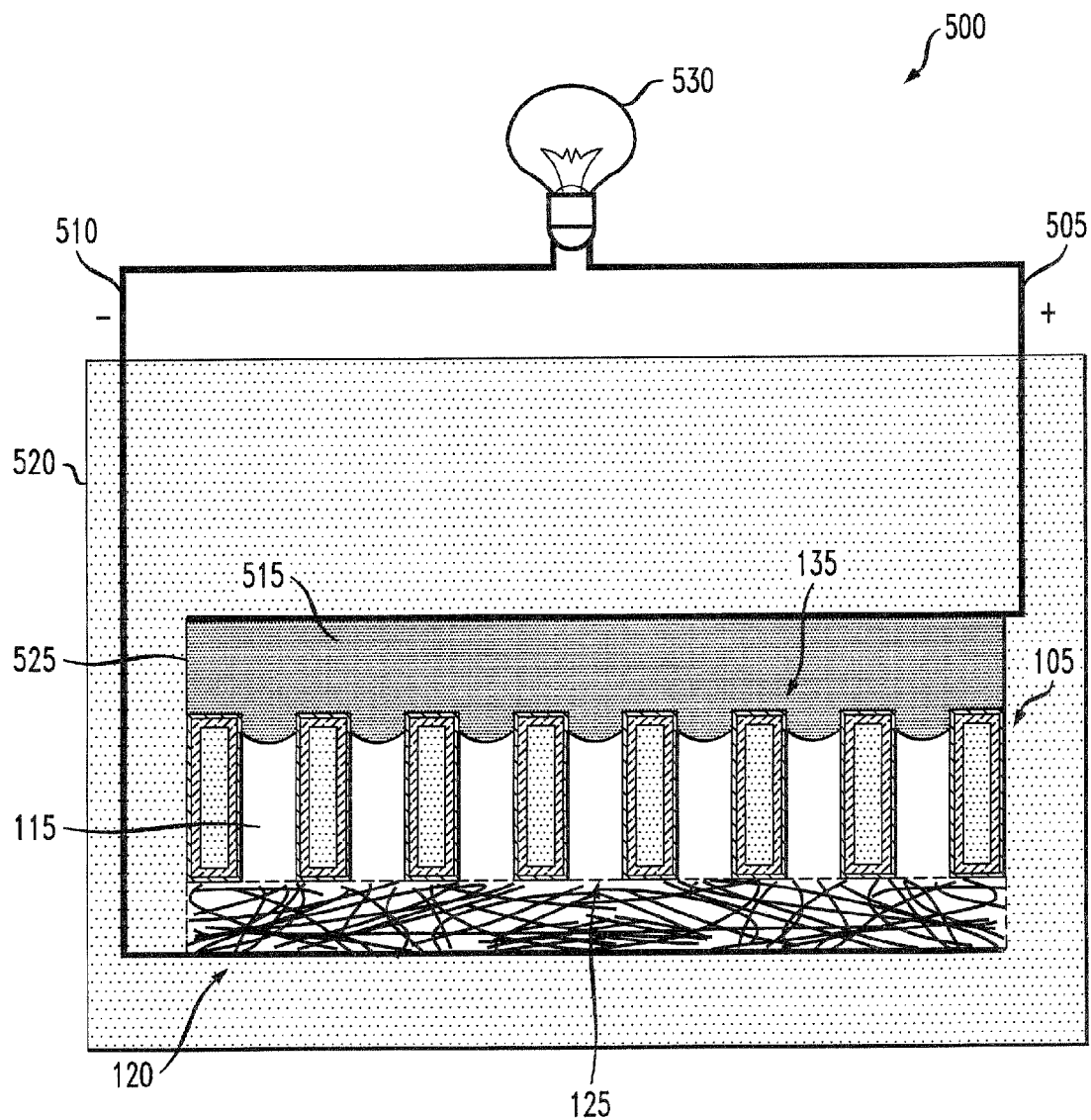
FIG. 5 presents a cross-sectional view of an example apparatus configured as a battery.

As further illustrated in FIG. 5, in some preferred embodiments, the apparatus is configured as a battery 500. The battery 500 can further include positive and negative electrodes 505, 510, an electrolyte fluid 515 and a housing 520 having a chamber 525 configured to accommodate the membrane 105 and wicking material 120. The membrane 105 and wicking material 120 could be any of the embodiments discussed above in the context of FIGS. 1-4.

When the battery 500 is in an inactive state, the membrane 105 and wicking material 120 are preferable located between, and thereby separation the electrolyte fluid 515 from one of the electrodes 505, 510. E.g., the wicking material can be adjacent one of the electrode 510, and the electrolyte fluid 515 rests on the second surface 135 of the fluid-support-structures 110. To activate the battery 500, the membrane 105 can be actuated as described above, thereby allowing the electrolyte fluid 515 to penetrate the fluid-support-structures 110 to the first surface 125, pass through the openings 115, and enter the wicking material 120. The electrolyte fluid 515 can pass out of the wicking material 120 to the electrode 505, thereby allowing an electrical current to flow through and power a load 530 (e.g., a light) coupled to the battery 500.

Figure 6:
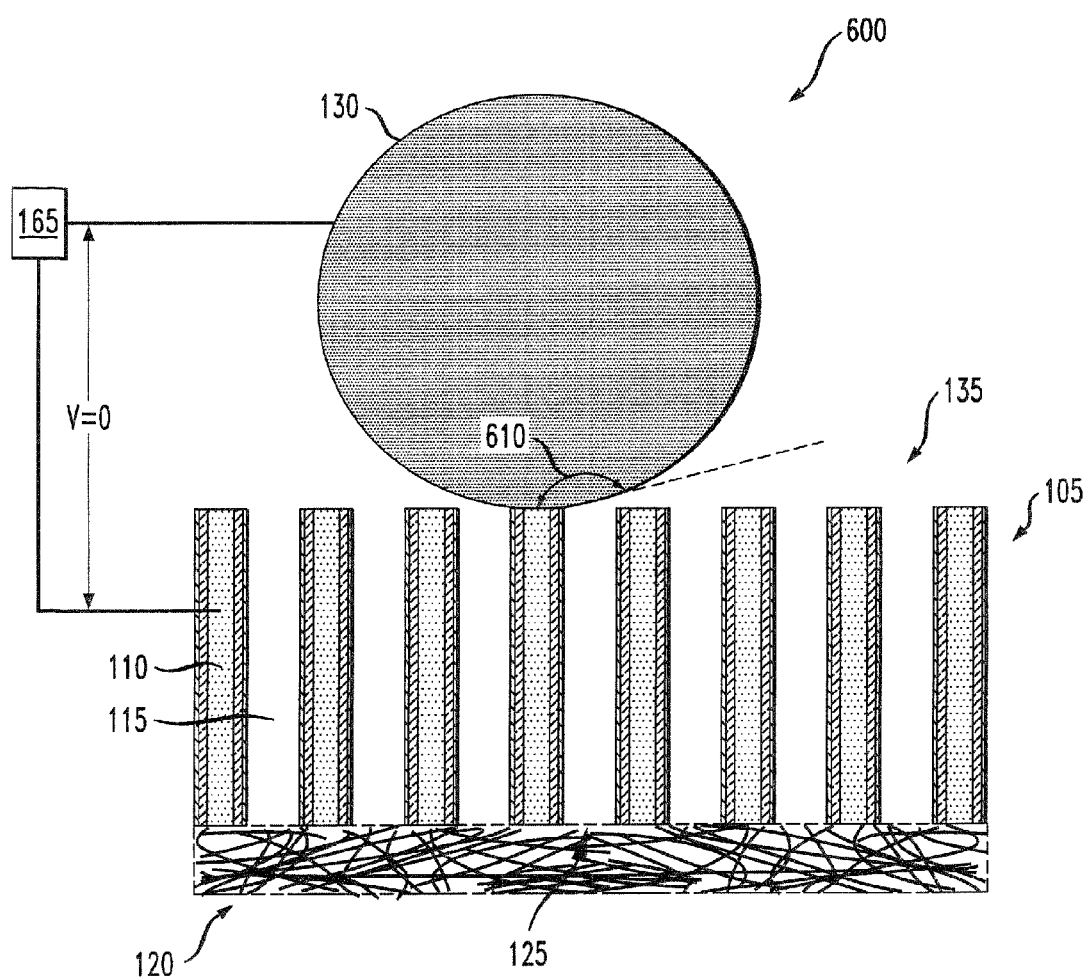
FIGS. 6-8 present cross-section views of an example apparatus at various stages of use.
Figure 7:
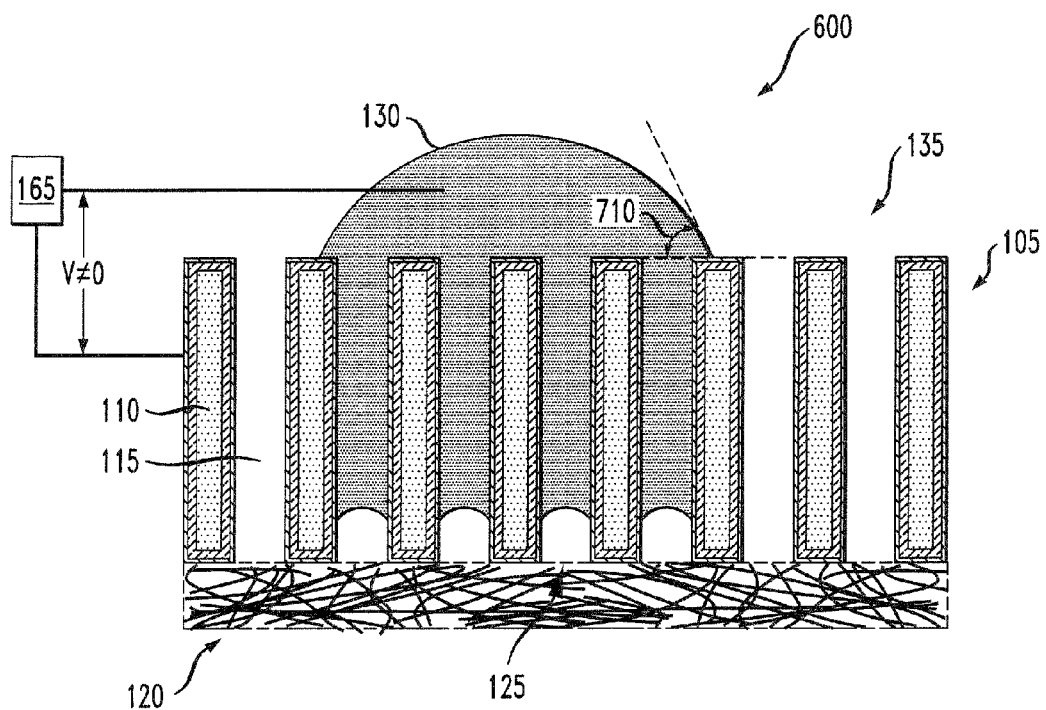
Figure 8:
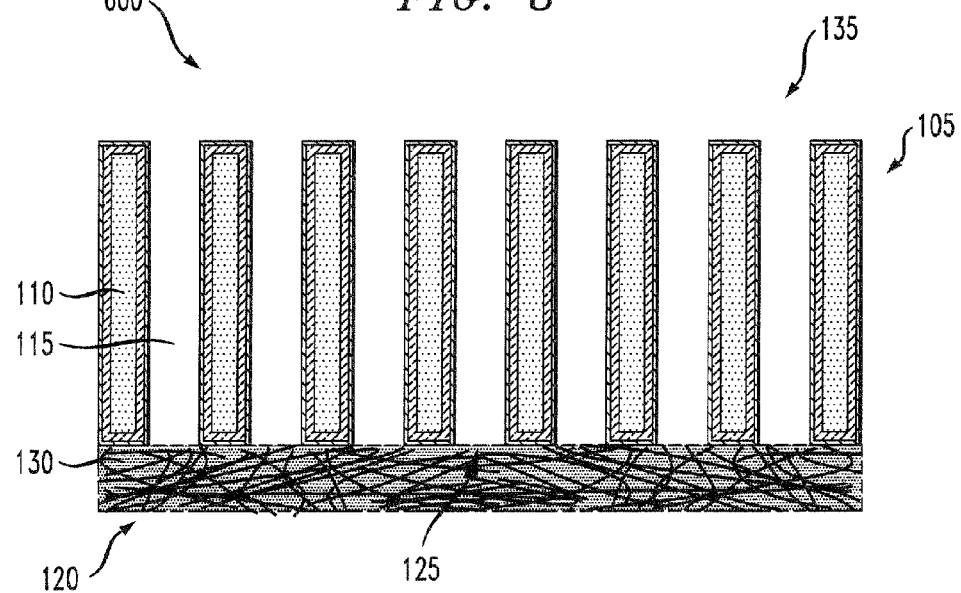

Another embodiment is a method of use. FIGS. 6-8 present cross-section views of an example apparatus 600, analogous to that shown in FIG. 1, at various stages of use that comprises moving a fluid 130 through the apparatus 600. Any of the various embodiments of the apparatus discussed above in the context of FIG. 1-5 could be used in the method. FIGS. 6-8 use the same reference numbers to depict analogous structures shown in FIG. 1.

FIG. 6 illustrates the apparatus 600 after placing the fluid 130 on the second surface 135 of a membrane 105 of the apparatus 600. For illustrative purposes the fluid 130 is depicted as a droplet. However, the fluid 130 could also be a layer of fluid. The membrane 105 can have any of the above-described configurations of fluid-support-structures 110 and openings 115 as discussed in the context of FIGS. 1-5. E.g. each of the fluid-support-structures 115 has at least one dimension of about 1 millimeter or less.

At the stage of use depicted in FIG. 6 the surface 135 of the fluid-support-structures 110 is a superhydrophobic surface. E.g., the surface 135 can support a droplet of the fluid 130 thereon such that the droplet has a contact angle 610 of about 140 degrees or more. Such surface properties can be attained when no voltage is applied between the fluid 130 and the fluid-support-structures 110. (e.g., V=0). When it is superhydrophobic, the surface 135 is substantially impermeable to the fluid 130, and therefore the fluid 130 remains at the tops of the fluid-support-structures 110 (e.g., the top 10 percent of the heights of the fluid-support-structures 110).

FIG. 7 shows the apparatus 600 while actuating the membrane 105 to cause the fluid 130 to move through the fluid-support-structures 110 to the openings 115. In some cases, the actuation comprises applying a non-zero voltage (e.g., V≠0) between the fluid 130 and the fluid-support-structures 110. When the non-zero voltage is thus applied, the surface 135 is wetted. E.g., the surface 135 can support a droplet of fluid 130 thereon such that the droplet has a contact angle 710 of about 90 degrees or less. When it is wetted, the surface 135 is permeable to the fluid 130, and therefore the fluid 130 penetrates into the fluid-support-structures 110. As already discussed above, similar changes in the wetability of the surface 135 can be achieved by applying a mechanical force to the membrane, to e.g., change a separation distance between the fluid-support-structures, and thereby actuate the membrane.

FIG. 8 shows the apparatus 600 while drawing the fluid 130 into a wicking material 120 of the apparatus 600 that is positioned adjacent to a surface 125 of the membrane 105. The wicking material 120 can be any of the above-described embodiments discussed in the context of FIGS. 1-5. When the fluid 130 reaches the openings 115 it contacts the wicking material 120 and capillary forces draw the fluid 130 into the wicking material 120, thereby facilitating passage of the fluid 130 through the openings 115.

Still another embodiment is a method of manufacturing an apparatus. FIGS. 9-14 present cross-sectional views of an example apparatus 900 at selected stages of manufacture. The cross-sectional and plan views that are analogous to that shown in FIGS. 1-3, and the same reference numbers are used to depict analogous structures shown in FIG. 1. Any of the above-described embodiments of apparatuses can be manufactured by the method.

FIGS. 9-12 show example steps in the formation of a membrane of the apparatus 900. Forming the membrane includes forming fluid-support-structures and openings.

Figure 9:
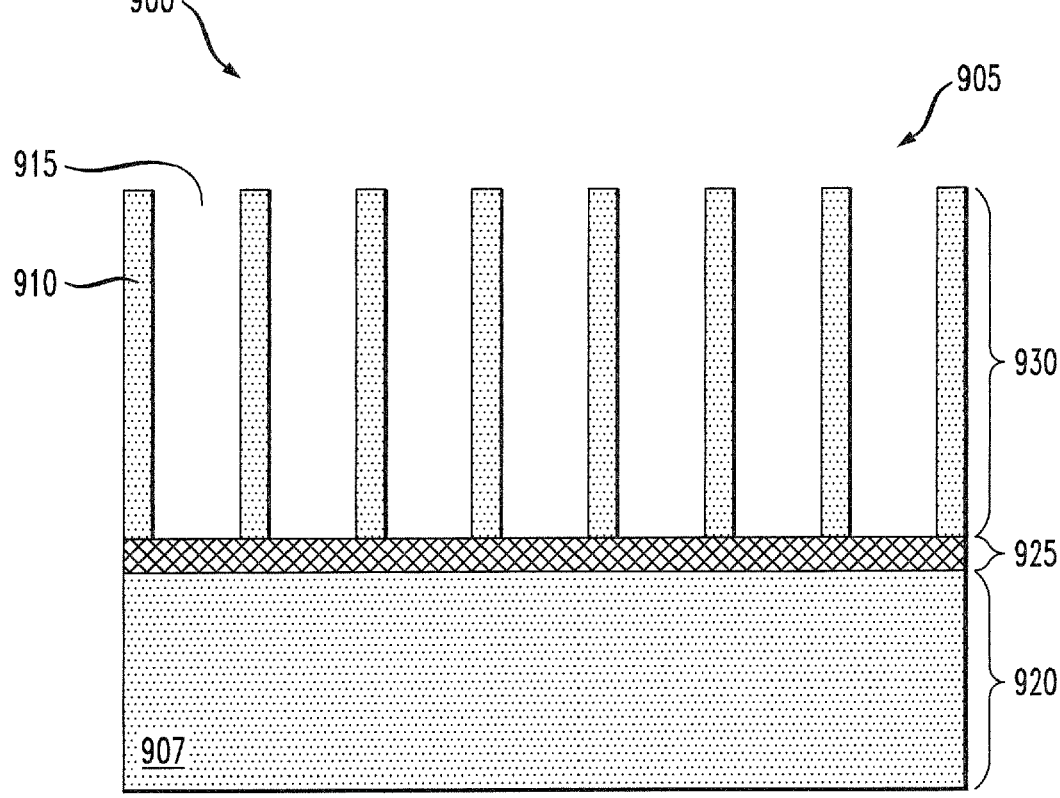
FIGS. 9-14 present cross-section and perspective views of an example apparatus at selected stages of manufacture.

In one embodiment the membrane is formed by patterning a substrate. FIG. 9 shows a cross-sectional view of a partially formed membrane 905 after patterning a substrate 907 to form the fluid-support-structures 910 and openings 915. In some preferred embodiments, the substrate 907 is a silicon-on-insulator (SOI) substrate comprising a bottom silicon layer 920, a silicon dioxide layer 925 and top silicon layer 930. The fluid-support-structures 910 can be formed by patterning the top silicon layer 930 using conventional semiconductor patterning and dry etching procedures well known to those skilled in the art. The silicon dioxide layer 925 advantageously serves as an etch stop. In other embodiments, the substrate 907 can comprise one or more planar layers made of these or other types of conventional materials that are suitable for patterning and etching.

As illustrated in FIG. 9, the openings 915 can be formed as part of forming fluid-support-structures 910 that are configured as closed cells, similar to that described above in the context of FIG. 1 and 3. Alternatively, the openings 915 can be formed in a base layer of a substrate that is etched to form the fluid-support-structures configured as posts, similar described above in the context of FIG. 2.

Figure 10:
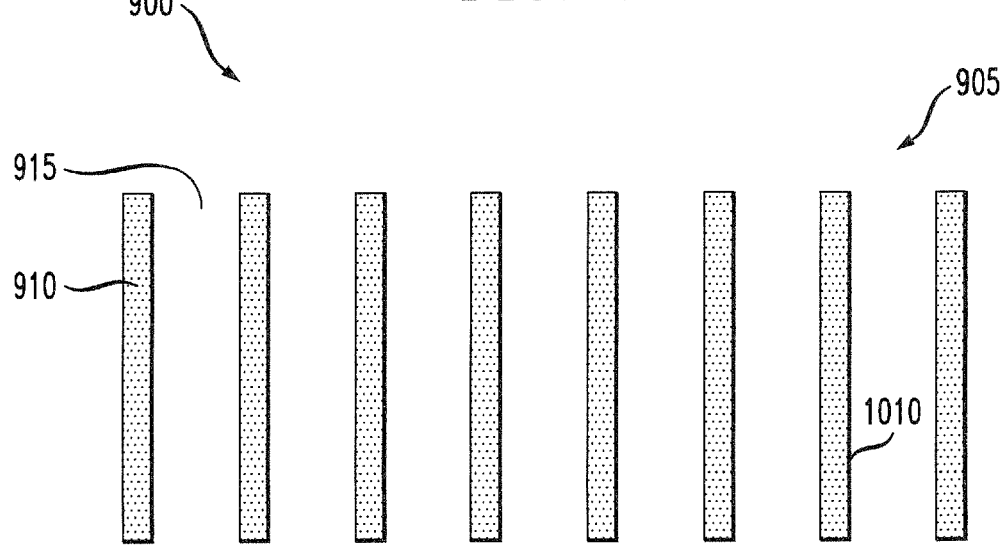

FIG. 10 shows a cross-sectional view of the apparatus 900 after performing an etch, e.g., a dry etch, to remove the bottom silicon layer 920 (FIG. 9). Again, the silicon dioxide layer 925 can be used as an etch-stop for the bottom silicon layer 920 etch (FIG. 9). FIG. 10 depicts the apparatus after also removing the silicon dioxide layer 925, e.g., via an acid-etching with hydrogen fluoride, to release the membrane 905 structure from the substrate 907. The membrane can comprise fluid-support-structures 910 configured as hexagonal cells or posts, and at least one dimension of the fluid-support-structures 910 have at least one dimension (e.g., the walls 1010 of the cells) that that is about 1 millimeter or less.

Figure 11:
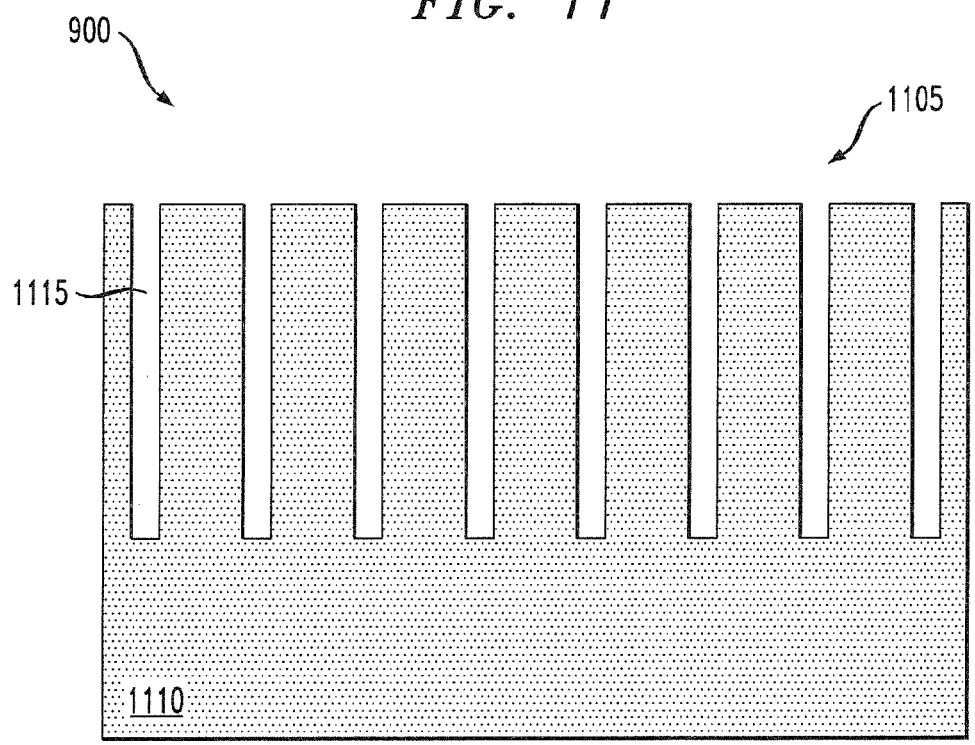

In an alternative embodiment of the method, the membrane can be formed by depositing a metal into a substrate template. FIG. 11 shows a cross-sectional view of a partially formed membrane 1105 after patterning a substrate 1110 to form grooves 1115. The substrate 1110 is configured as a template with the groove 1115 defining a reverse pattern of the desired fluid-support-structures. The substrate 1110 can comprise e.g., a silicon substrate that is subject to conventional semiconductor patterning and dry etching procedures, similar to that discussed above in the context of FIG. 9.

Figure 12:
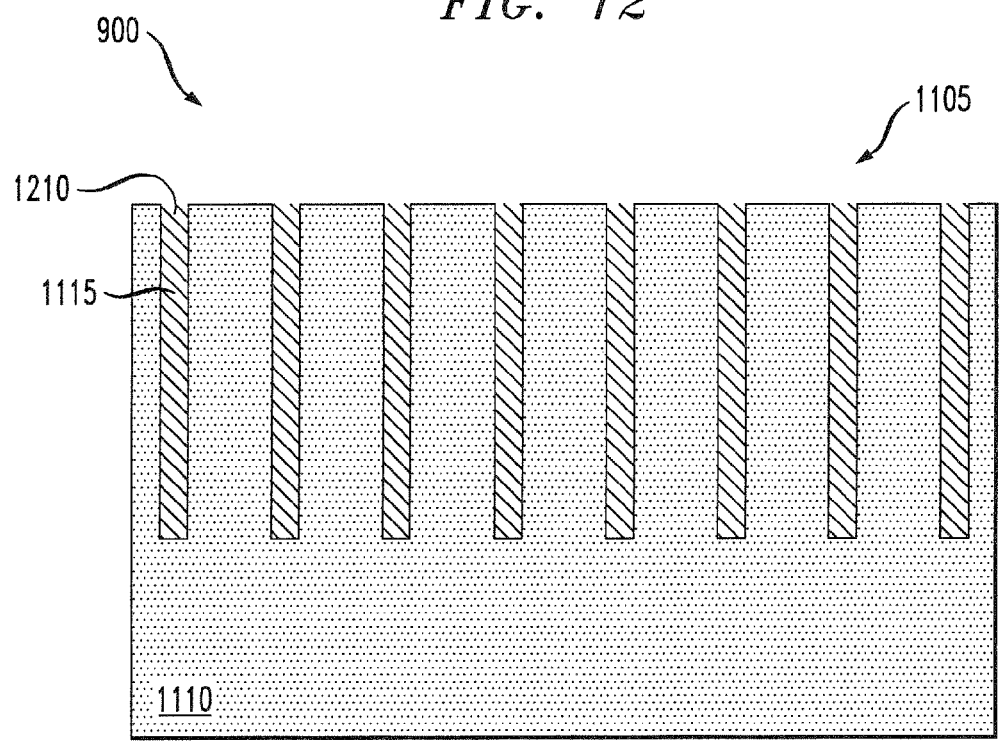

As further illustrated in FIG. 12, the groves 1115 can then be filled with a metal to form the fluid-support-structures 1210 of the membrane 1105. E.g., in some cases, the grooves 1115 are filled with tantalum using conventional electrochemical deposition procedures well known to those skilled in the art. Thereafter, the substrate 1110 can be removed via conventional etching procedures, e.g., similar to that discusses in the context of FIGS. 9-10, to release the metal membrane 1105 structure from the substrate 1110.

Figure 13:
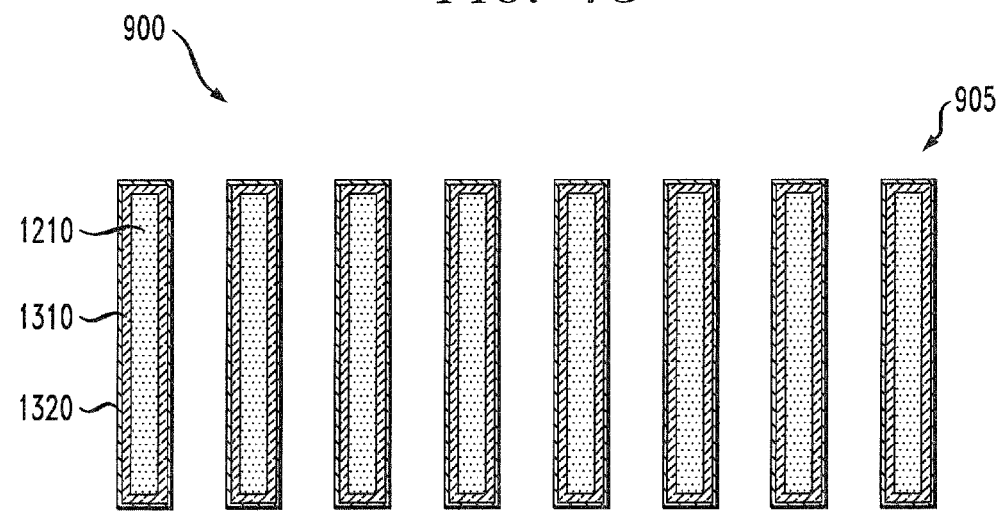

In some preferred embodiments forming the membrane further includes coating the fluid-support structures with an insulating layer and depositing a low surface energy coating on the insulating layer. FIG. 13 shows the apparatus 900 after forming an insulating layer 1310 on the fluid-support-structures 910. E.g., silicon fluid-support-structures 910 (FIG. 10) or metal fluid-support-structures 1210 (FIG. 12) can be oxidized. E.g., a membrane 1105 whose fluid-support-structures 1210 are made of tantalum can be subject to a convention anodization process to form a tantalum oxide ($Ta_2O_5$) insulating layer 1310. E.g., the outer surfaces of silicon fluid-support-structures 910 can be oxidized to form an insulating layer comprising silicon oxide.

FIG. 13 also shows the apparatus 900 after depositing a low surface energy coating 1320 on the insulating layer 1310. Any of the low surface energy materials discussed above in the context of FIG. 1 can be used. E.g., the low surface energy coating 1320 can be deposited via chemical vapor depositing of a low surface energy material comprising a fluorinated polymer. Alternatively, the membrane can be dipped in or sprayed with a solution containing low surface energy material, e.g., a solution of a silane in hexane, to form a low surface energy material coating 1320 comprising e.g., an alkylsilane.

Figure 14:
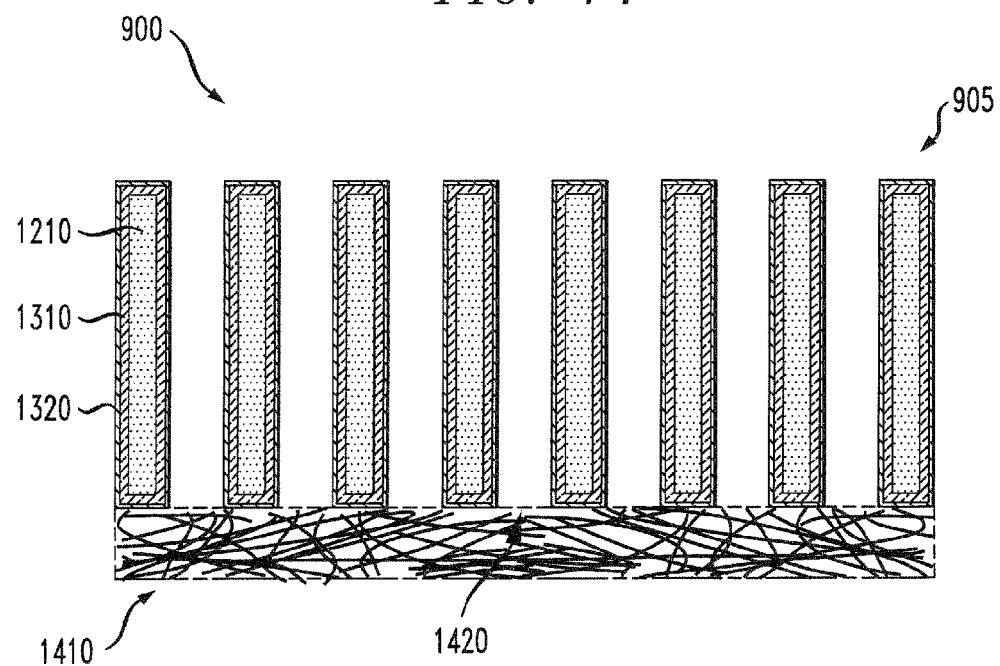

FIG. 14 shows the apparatus 900 after positioning a wicking material 1410 adjacent the openings 915 of the membrane 905 (or the membrane 1105). The wicking material 1410 can be obtained from commercial sources well known to those skilled in the art (e.g., Glass Fiber Filter, type APFC, Millipore Corp., Bedford, Mass. USA). Alternatively, the wicking material 1410 can be manufactured by, e.g., forming fibers and layering the fibers on top of each other.

Positioning the wicking material 1410 can comprise contacting the wicking material 1410 to a surface 1420 of the membrane 905 having the openings 915. In some cases, the wicking material 1410 is infiltrated with a liquid (e.g., water) and then contacted to the membrane 905 while the wicking material 1410 is still wet. Wetting helps establish multiple contact points where attractive van der waals forces can occur between the membrane 905 and the wicking material 1310. Alternatively, the wicking material 1410 and membrane 905 can be compressed together, to promote adhesion of the wicking material 1410 to the membrane 905.

Although the present invention has been described in detail, those of ordinary skill in the art should understand that they can make various changes, substitutions and alterations herein without departing from the scope of the invention.

What is claimed is:

1. An apparatus, comprising:
   a membrane having a plurality of fluid-support-structures and openings located between said fluid-support-structures; and
   a wicking material positioned adjacent to said openings at a surface of said membrane,
   wherein said fluid-support-structures have at least one dimension that is about 1 millimeter or less, and when a fluid locatable on a second surface of said membrane penetrates said fluid-support-structures, at least a portion of said fluid passes through said openings and into said wicking material.

2. The apparatus of claim 1, wherein said wicking material comprises a hydrophilic permeable media.

3. The apparatus of claim 1, wherein said wicking material has a thickness of about 1 micron to 1000 microns.

4. The apparatus of claim 1, wherein said wicking material has gaps with an average lateral separation that is at least 5 times less than a size of said openings.

5. The apparatus of claim 1, wherein said wicking material comprises fibers having a bend radius that is at least about 5 times greater than a size of the openings.

6. The apparatus of claim 1, wherein said wicking material comprises fibers having an average diameter ranging from about 100 to 700 nanometers.

7. The apparatus of claim 1, further including a second wicking material positioned adjacent to a second surface of said membrane that is opposite said surface.

8. The apparatus of claim 1, wherein said membrane is a multilayered membrane, each of a plurality of membrane layers comprising said fluid-support-structures and said openings, and wherein at least one of a plurality of layers of said wicking material are positioned adjacent one of said membrane layers.

9. The apparatus of claim 1, wherein said penetration of said fluid is actuated by applying a voltage between said fluid and said fluid-support-structures.

10. The apparatus of claim 1, further comprising an electrical source that is electrically coupled to said fluid-support-structures, said electrical source configured to apply a voltage between electrically connected said fluid-support-structures and said fluid, to thereby cause said fluid to have a contact angle of less than 90 degrees.

11. The apparatus of claim 1, wherein each of said fluid-support-structures comprises a post and said one dimension is a lateral thickness of said post.

12. The apparatus of claim 1, wherein each of said fluid-support-structures configured as a cells and said at least one dimension is a lateral thickness of a wall of said cell.

13. The apparatus of claim 1, wherein said apparatus is configured as a battery.

14. The apparatus of claim 13, wherein said membrane and wicking material separate an electrolyte fluid from an electrode of said battery.

15. A method of use, comprising:
moving a fluid through an apparatus including:
placing said fluid on a surface of a membrane of said apparatus, said membrane having a plurality of fluid-support-structures and openings located between said fluid-support-structures, wherein said fluid-support-structures have at least one dimension that that is about 1 millimeter or less;
actuating said membrane to cause said fluid to move through said fluid-support-structures to said openings; and
drawing said fluid into a wicking material of said apparatus, said wicking material being positioned adjacent to said openings at a surface of said membrane.

16. The method of claim 15, wherein said actuating comprises applying a non-zero voltage between said fluid and said fluid-support-structures.

17. The method of claim 15, wherein said actuating comprises applying a mechanical force said membrane.

18. A method of manufacturing an apparatus, comprising:
forming a membrane including:
forming fluid-support-structures on or in a substrate, wherein said fluid-support-structures have at least one dimension that is about 1 millimeter or less; and
forming openings in said substrate; and
positioning a wicking material adjacent said openings.

19. The method of claim 18, wherein forming said fluid-support-structures comprises patterning a top silicon layer of a SOI substrate.

20. The method of claim 18, wherein forming said fluid-support-structures comprises electrodepositing a metal into groves of a template for said membrane.

* * * * *

UNITED STATES PATENT AND TRADEMARK OFFICE
CERTIFICATE OF CORRECTION

PATENT NO. : 7,695,550 B2  Page 1 of 1
APPLICATION NO. : 11/460901
DATED : April 13, 2010
INVENTOR(S) : Thomas Nikita Krupenkin et al.

It is certified that error appears in the above-identified patent and that said Letters Patent is hereby corrected as shown below:

On the title page, item:

(73) Assignee: "Alcatel-Lucent USA Inc.
Murray Hill, NJ (US)"

should read

--Alcatel-Lucent USA Inc.
Murray Hill, NJ (US);
mPhase Technologies, Inc.
Norwalk, CT (US)--

Signed and Sealed this

Twenty-seventh Day of July, 2010

David J. Kappos
*Director of the United States Patent and Trademark Office*